US009268973B2

(12) United States Patent
Yamamoto et al.

(10) Patent No.: US 9,268,973 B2
(45) Date of Patent: Feb. 23, 2016

(54) SENSOR OUTPUT CORRECTION CIRCUIT, SENSOR OUTPUT CORRECTION DEVICE, AND SENSOR OUTPUT CORRECTION METHOD

(71) Applicants: Konosuke Yamamoto, Tokyo (JP); Yoichi Kimura, Tokyo (JP)

(72) Inventors: Konosuke Yamamoto, Tokyo (JP); Yoichi Kimura, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 284 days.

(21) Appl. No.: 13/719,495

(22) Filed: Dec. 19, 2012

(65) Prior Publication Data

US 2013/0176068 A1 Jul. 11, 2013

(30) Foreign Application Priority Data

Jan. 10, 2012 (JP) .................................. 2012-002046

(51) Int. Cl.
*G01R 31/00* (2006.01)
*G06G 7/04* (2006.01)
*H03M 3/00* (2006.01)

(52) U.S. Cl.
CPC ................. *G06G 7/04* (2013.01); *H03M 3/388* (2013.01); *H03M 3/458* (2013.01)

(58) Field of Classification Search
None
See application file for complete search history.

(56) References Cited

U.S. PATENT DOCUMENTS 3,133,190 A * 5/1964 Eckert, Jr. ................. G06F 7/57
708/604
7,414,553 B1 * 8/2008 Tsyrganovich ............... 341/118

FOREIGN PATENT DOCUMENTS

JP 2005-020681 1/2005

* cited by examiner

*Primary Examiner* — Paresh Patel
(74) *Attorney, Agent, or Firm* — IPUSA, PLLC

(57) ABSTRACT

A sensor output correction circuit includes an analog-to-digital converter configured to receive an input voltage corresponding to a sensor output of a sensor and a reference voltage that are selectively input to the analog-to-digital converter; and an arithmetic unit configured to correct output data, which is output from the analog-to-digital converter when the input voltage is input to the analog-to-digital converter, based on an output value that is output from the analog-to-digital converter when the reference voltage is input to the analog-to-digital converter. The arithmetic unit includes a multiply adder and a non-restoring divider.

7 Claims, 4 Drawing Sheets

SENSOR OUTPUT CORRECTION CIRCUIT, SENSOR OUTPUT CORRECTION DEVICE, AND SENSOR OUTPUT CORRECTION METHOD

CROSS-REFERENCE TO RELATED APPLICATION

The present application is based upon and claims the benefit of priority of Japanese Patent Application No. 2012-002046, filed on Jan. 10, 2012, the entire contents of which are incorporated herein by reference.

BACKGROUND OF THE INVENTION

1. Field of the Invention

An aspect of this disclosure relates to a sensor output correction circuit, a sensor output correction device, and a sensor output correction method.

2. Description of the Related Art

Japanese Laid-Open Patent Publication No. 2005-020681, for example, discloses an output correction device for correcting sensor outputs. In the disclosed output correction device, values for correcting pixel values output from an image sensor are defined in a table for respective pixels.

With the related-art technology, however, the size of the table used to correct sensor outputs increases as the desired correction accuracy increases. Accordingly, when the memory capacity is limited, the size of the table is limited and the accuracy of correcting sensor outputs is also limited.

SUMMARY OF THE INVENTION

According to an aspect of this disclosure, there is provided a sensor output correction circuit that includes an analog-to-digital converter configured to receive an input voltage corresponding to a sensor output of a sensor and a reference voltage that are selectively input to the analog-to-digital converter; and an arithmetic unit configured to correct output data, which is output from the analog-to-digital converter when the input voltage is input to the analog-to-digital converter, based on an output value that is output from the analog-to-digital converter when the reference voltage is input to the analog-to-digital converter. The arithmetic unit includes a multiply adder and a non-restoring divider.

DESCRIPTION OF THE PREFERRED EMBODIMENTS

Preferred embodiments of the present invention are described below with reference to the accompanying drawings.

Figure 1:
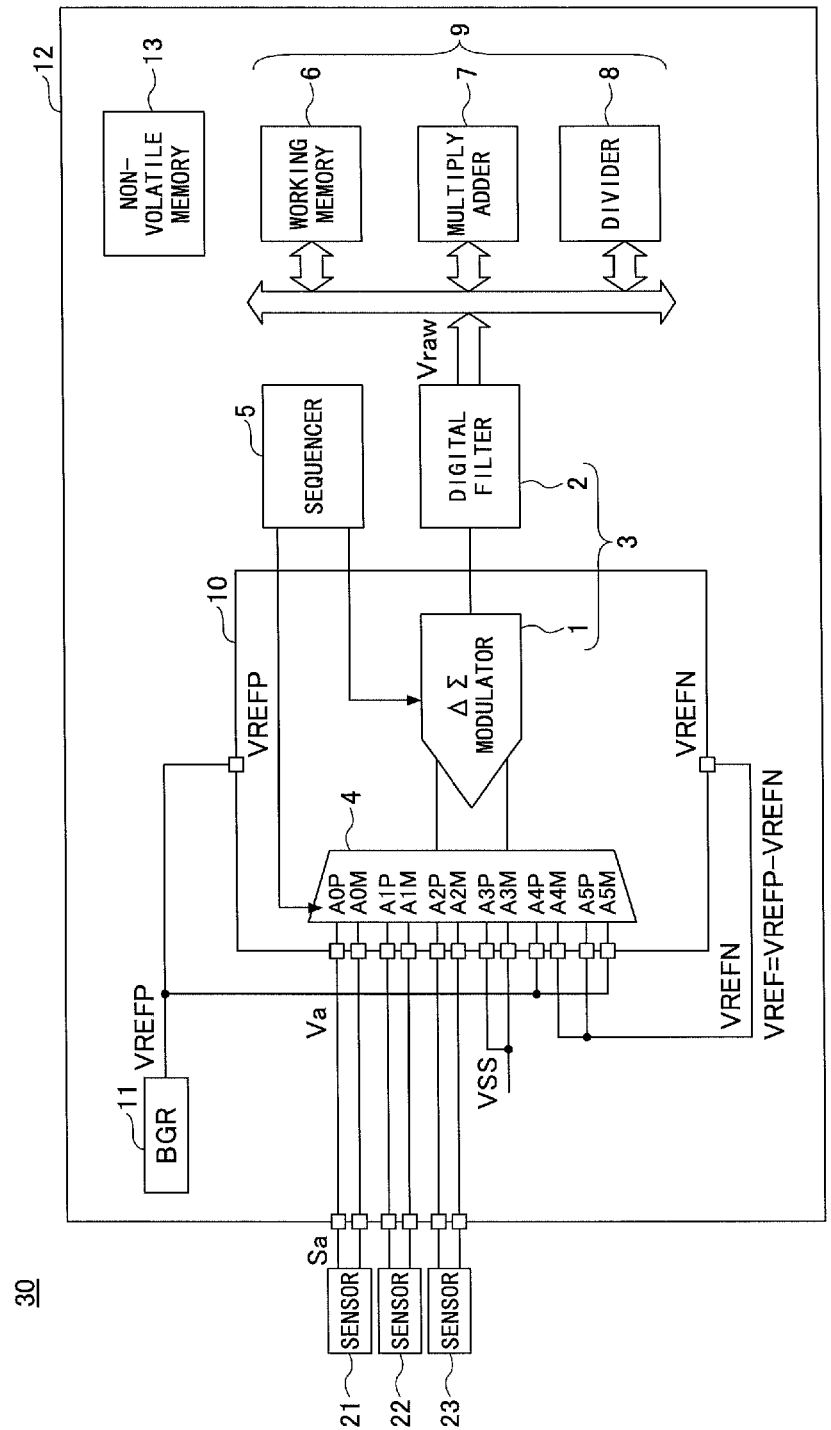
FIG. 1 is a drawing illustrating an exemplary configuration of a sensor output correction device according to an embodiment.

FIG. 1 is a drawing illustrating an exemplary configuration of a sensor output correction device 30 according to an embodiment. The sensor output correction device 30 is a sensor correction system including sensors 21-23 and a sensor output correction circuit 12. The sensors 21-23 detect predetermined physical quantities and output detection signals corresponding to the detected physical quantities as sensor outputs. Examples of the sensors 21-23 for detecting physical quantities include pressure sensors, temperature sensors, voltage sensors, current sensors, strain sensors, magnetometric sensors, and flow rate sensors. In the example of FIG. 1, plural sensors 21-23 are connected to the sensor output correction circuit 12. However, the number of sensors whose outputs are corrected by the sensor output correction circuit 12 is not limited to any specific number.

Below, for descriptive purposes, it is assumed that a detection signal Sa that is a sensor output from the sensor 21 is corrected by the sensor output correction circuit 12.

The sensor output correction circuit 12 is a semiconductor integrated circuit that includes no microcomputer. The sensor output correction circuit 12 may include a band gap reference (BGR) circuit 11, an input circuit 10, a digital filter 2, an arithmetic circuit 9, and a sequencer 5. The band gap reference circuit 11 and the input circuit 10 are implemented by analog circuits. The digital filter 2, the arithmetic circuit 9, and the sequencer 5 are implemented by digital circuits.

The band gap reference circuit 11 is a reference voltage generating circuit that generates and outputs a constant reference voltage VREF. The reference voltage VREF corresponds to a potential difference obtained by subtracting an electric potential VREFN at the low potential side of the band gap reference circuit 11 from an electric potential VREFP at the high potential side of the band gap reference circuit 11 (i.e., VREF=VREFP−VREFN).

The input circuit 10 is an input interface to which a detection voltage Va corresponding to the detection signal Sa is input. The input circuit 10 includes a multiplexer 4 and a delta-sigma ($\Delta\Sigma$) modulator 1. The $\Delta\Sigma$ modulator 1 and the digital filter 2 constitute an analog-to-digital (AD) converter 3.

The multiplexer 4 is a switching circuit that includes plural input channels and is configured to select some of voltages input to the input channels and output the selected voltages. In the example of FIG. 1, the multiplexer 4 includes six input channels. Each input channel is implemented by a differential input circuit including a non-inverting input terminal and an inverting input terminal. In FIG. 1, A*P indicates a non-inverting input terminal and A*M indicates an inverting input terminal (where "*" indicates an integer). For example, an input channel ch0, to which the detection voltage Va corresponding to the detection signal Sa from the sensor 21 is input, is implemented by a differential input circuit including a non-inverting input terminal A0P and an inverting input terminal A0M. Other input channels ch1 through ch5 are also implemented by differential input circuits.

In the example of FIG. 1, the detection voltage Va corresponding to the detection signal Sa of the sensor 21 is input to the input channel ch0, a potential difference±0 between VSS potentials (ground potentials) is input as a constant first reference voltage to the input channel ch3, +VREF (=VREFP−VREFN) is input as a constant second reference voltage to the input channel ch4, and −VREF (=VREFN−VREFP) is input as a third reference voltage to the input channel ch5.

Based on a selection command signal output from the sequencer 5, the multiplexer 4 selects voltages to be output to the $\Delta\Sigma$ modulator 1 of the AD converter 3 (i.e., voltages to be input to the $\Delta\Sigma$ modulator 1) from the voltages input to the input channels ch0 through ch5. In other words, the multiplexer 4 outputs voltages input to some of the input channels ch0 through ch5 specified by the sequencer 5 to the ΔΣ modulator 1. Here, for descriptive purposes, it is assumed that the multiplexer selectively outputs the detection voltage Va and plural constant reference voltages (e.g., ±0, +VREF, −VREF) to the ΔΣ modulator 1 of the AD converter 3.

The AD converter 3 is a ΔΣ analog-to-digital conversion circuit that samples and measures an analog voltage input from the multiplexer 4 to the ΔΣ modulator 1 when sampling is allowed by the sequencer 5 (i.e., when the AD converter 3 is enabled by the sequencer 5). The AD converter 3 includes the ΔΣ modulator 1 and the digital filter 2.

When the ΔΣ modulator 1 is enabled by the sequencer 5, the ΔΣ modulator 1 outputs one-bit digital data that varies depending on an analog input voltage input from the multiplexer 4. When the digital filter 2 is enabled by the sequencer 5, the digital filter 2 performs signal processing on the digital data output from the ΔΣ modulator 1. The digital filter 2 may be implemented by a decimation filter such as a cascaded integrator and comb (CIC) filter.

Figure 2:
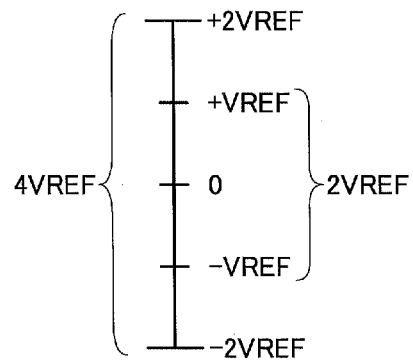
FIG. 2 is a drawing used to describe an input voltage range of a $\Delta\Sigma$ modulator.

FIG. 2 is a drawing used to describe an input voltage range of the ΔΣ modulator 1. In FIG. 2, it is assumed that the original full scale range of the ΔΣ modulator 1 (the maximum range of voltages that can be input to the ΔΣ modulator 1) is set at a multiple of the reference voltage VREF (in this example, 4 VREF between −2 VREF and +2 VREF). In such a case, the input voltage range of the ΔΣ modulator 1 is preferably limited to a range (e.g., 2 VREF between −VREF and +VREF) narrower than the original full scale range.

Limiting the input voltage range of the ΔΣ modulator 1 makes it possible to prevent the range of correctable output data Vraw, which is output from the digital filter 2 of the AD converter 3, from being limited. That is, with the input voltage range of the ΔΣ modulator 1 limited, the arithmetic circuit 9 of the digital domain is not saturated and the output data Vraw can be corrected even when the gain and offset of the ΔΣ modulator 1 of the AD converter 3 vary greatly.

The arithmetic circuit 9 corrects the digital output data Vraw output from the digital filter 2 of the AD converter 3 according to a control signal output from the sequencer 5. More specifically, the arithmetic circuit 9 corrects a deviation of the output data Vraw from a predetermined reference value which is caused by variation of the gain and offset of the AD converter 3. The arithmetic unit 9 includes a multiply adder 7, a non-restoring divider 8, and a working memory 6 such as a random access memory (RAM).

For example, when values x, y, and z are input, the multiply adder 7 performs a calculation "xy+z" and outputs the calculation result. In addition to the calculation "xy+z", the multiply adder 7 can also perform calculations such as "xy−z", "−xy+z", and "−xy−z" and output the calculation results.

Meanwhile, when, for example, values x and y are input, the divider 8 performs a calculation "x/y" using a non-restoring method and outputs the calculation result. Using a non-restoring method makes it possible to reduce the circuit size of the divider 8.

Figure 3:
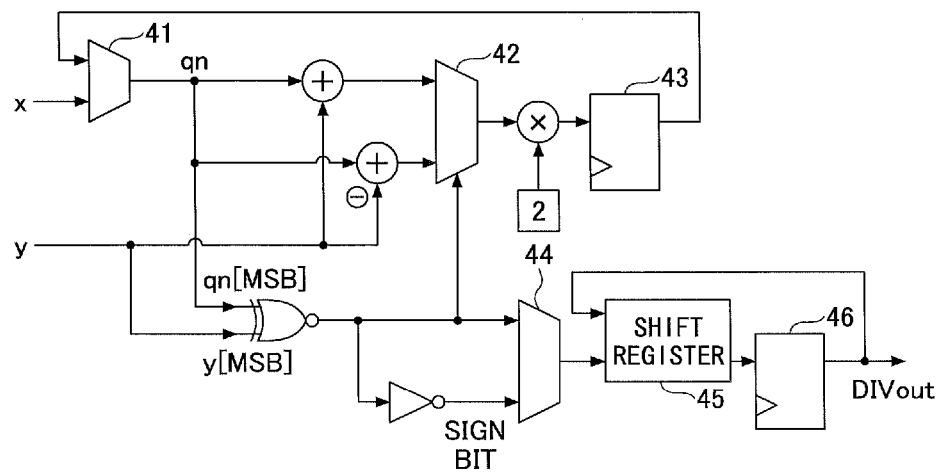
FIG. 3 is a circuit diagram illustrating an exemplary configuration of a divider employing a non-restoring method.

FIG. 3 is a circuit diagram illustrating an exemplary configuration of the divider 8 employing a non-restoring method. When a dividend x and a divisor y expressed by two's complements are input to the divider and the divider 8 is enabled by the sequencer 5, a division process including steps P1 through P11 is performed as described below.
(Step P1)
A multiplexer 41 selects x as a dividend qn only for the first time.
(Step P2)
When the sign bit (i.e., the most significant bit) of the dividend qn and the sign bit (i.e., the most significant bit) of the divisor y are different from each other, a multiplexer 42 selects qn+y. Meanwhile, when the sign bit of the dividend qn and the sign bit of the divisor y are the same, the multiplexer 42 selects qn−y.
(Step P3)
The selected value is multiplied by 2 (or shifted by one bit) and input to a flip-flop 43.
(Step P4)
When the sign bit (i.e., the most significant bit) of the dividend qn and the sign bit (i.e., the most significant bit) of the divisor y are different from each other, a multiplexer 44 selects "1" as the sign bit of a divider output value DIVout that is a division result of the divider 8. Meanwhile, when the sign bit of the dividend qn and the sign bit of the divisor y are the same, the multiplexer 44 selects "0" as the sign bit of the divider output value DIVout.
(Step P5)
A signal indicating the sign bit selected in step P4 is input via a shift register 45 to a flip-flop 46.
(Step P6)
The multiplexer 41 selects an output from the flip-flop 43 as the dividend qn.
(Step P7)
When the sign bit (i.e., the most significant bit) of the dividend qn and the sign bit (i.e., the most significant bit) of the divisor y are different from each other, the multiplexer 42 selects qn+y. Meanwhile, when the sign bit of the dividend qn and the sign bit of the divisor y are the same, the multiplexer 42 selects qn−y.
(Step P8)
The selected value is multiplied by 2 (or shifted by one bit) and input to a flip-flop 43.
(Step P9)
When the sign bit (i.e., the most significant bit) of the dividend qn and the sign bit (i.e., the most significant bit) of the divisor y are different from each other, the multiplexer 44 selects "0". Meanwhile, when the sign bit of the dividend qn and the sign bit of the divisor y are the same, the multiplexer 44 selects "1".
(Step P10)
The shift register 45 shifts an output from the flip-flop 46 by one bit to the left, inputs the value selected in step P9 to the least significant bit of the shifted output, and inputs the result to the flip-flop 46.
(Step P11)
Steps P6 through P10 are repeated for a number of times corresponding to "the number of bits of DIVout−1" to obtain a division result.

Since the divider 8 employing the non-restoring method as described above needs no multiplier (the multiplication in FIG. 3 can be performed by a bit-shift operation), it is possible to provide the divider with a small circuit size. Also, a non-restoring method makes it possible to perform division taking into account signs.

Next, a method of calculating correction values for correcting the output data Vraw output from the digital filter 2 of the AD converter 3 is described.

When V indicates an input voltage to the ΔΣ modulator 1, "a" indicates a gain of the ΔΣ modulator 1, and "b" indicates an offset of the ΔΣ modulator 1, the output data Vraw output from the digital filter 2 is expressed by formula (1) below.

$$V_{raw} = aV + b \qquad (1)$$

When a indicates a gain correction factor and β indicates an offset correction factor, a corrected AD conversion result Vcomp is expressed by formula (2) below.

$$V_{comp} = \alpha V_{raw} + \beta \quad (2)$$

In formula (2) the gain correction factor α and the offset correction factor β are correction values for correcting the output data Vraw.

Thus, the corrected AD conversion result Vcomp is obtained by correcting the gain "a" and the offset "b" of the ΔΣ modulator 1 and thereby removing errors in the gain "a" and the offset "b". Here, the full scale range of input voltages of the ΔΣ modulator 1 is 4 Vref, and the output data Vraw between −1 and +1 within the full scale range is output from the digital filter 2. Therefore, the relationship between Vcomp and V is expressed by formula (3) below.

$$V_{comp} = \frac{1}{2Vref} V \quad (3)$$
$$= \frac{1}{2Vref}\left(\frac{1}{a}V_{raw} - \frac{b}{a}\right)$$

Accordingly, the gain correction factor α and the offset correction factor β are expressed by formula (4) below.

$$\alpha = \frac{1}{2aVref}, \quad (4)$$
$$\beta = -\frac{b}{2aVref}$$

Also, as is apparent from FIG. 4, the gain "a" and the offset "b" of the ΔΣ modulator 1 are expressed by formula (5) below.

$$a = \frac{V_{ch4} - V_{ch5}}{+Vref - (-Vref)}, \quad (5)$$
$$b = \frac{V_{ch4} + V_{ch5}}{2}$$

Figure 4:
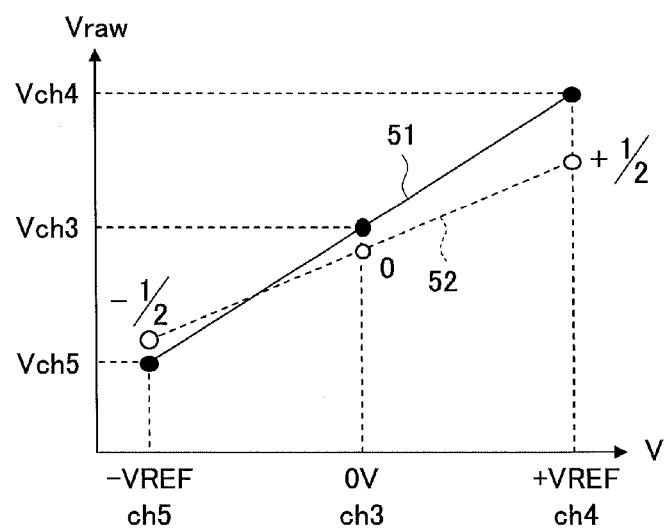
FIG. 4 is a graph illustrating a relationship between inputs to a $\Delta\Sigma$ modulator and outputs from a digital filter.

FIG. 4 is a graph illustrating a relationship between the input voltage V and the output data Vraw of the AD converter 3. In FIG. 4, a solid line 51 indicates the relationship before correction and a dotted line 52 indicates the relationship after correction.

Formula (6) below is obtained by substituting formula (5) in formula (4).

$$\alpha = \frac{1}{V_{ch4} - V_{ch5}}, \quad (6)$$
$$\beta = -\frac{V_{ch4} + V_{ch5}}{2}\alpha$$

Figure 5:
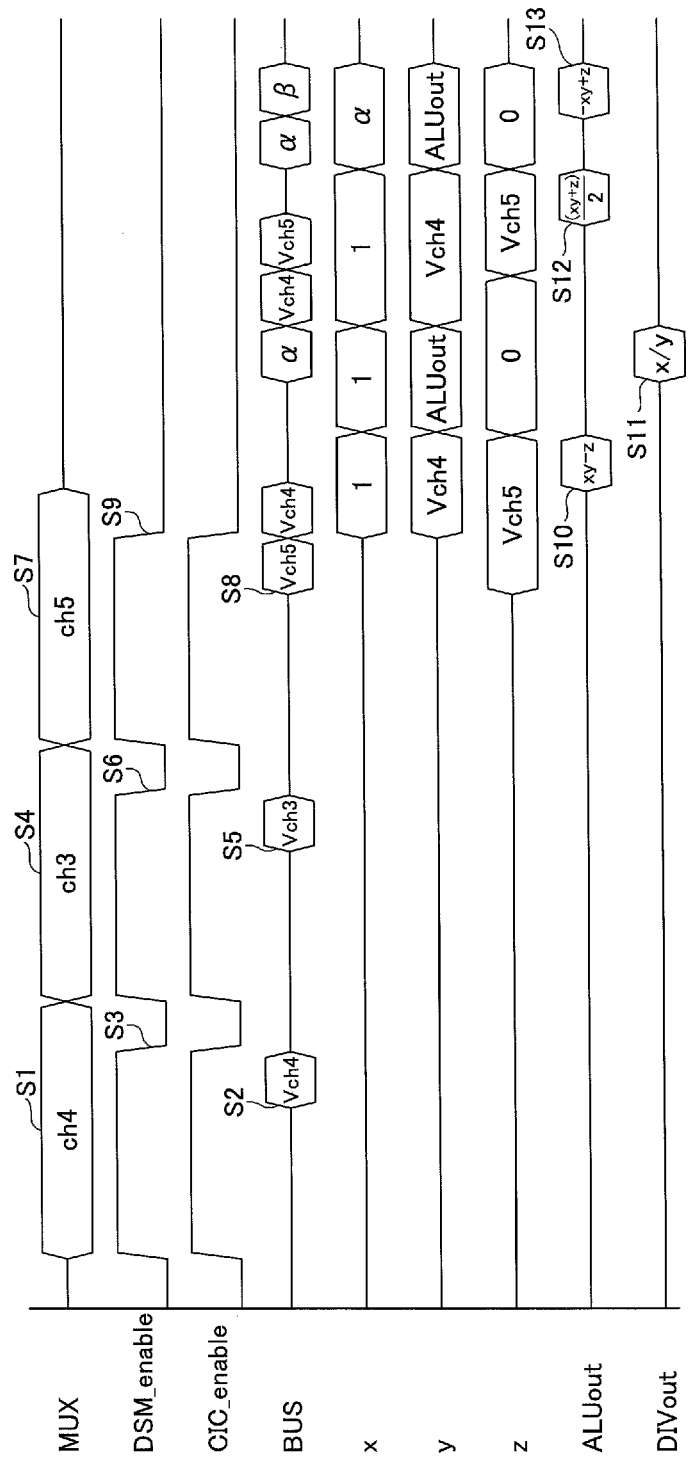
FIG. 5 is a timing chart used to describe an exemplary correction value calculation process.

When receiving an instruction to calculate correction values (the gain correction factor α and the offset correction factor β), the sequencer 5 performs a process including steps S1 through S13 described below according to the instruction. FIG. 5 is a timing chart used to describe an exemplary correction value calculation process.

(Step S1)
The sequencer 5 switches the multiplexer 4 to the channel ch4 and enables the ΔΣ modulator 1 and the digital filter 2.

(Step S2)
The sequencer 5 stores an output Vch4 (see FIG. 4) output from the digital filter 2 in step S1 in the working memory 6.

(Step S3)
The sequencer 5 disables the ΔΣ modulator 1 and the digital filter 2.

(Step S4)
The sequencer 5 switches the multiplexer 4 to the channel ch3 and enables the ΔΣ modulator 1 and the digital filter 2.

(Step S5)
The sequencer 5 stores an output Vch3 (see FIG. 4) output from the digital filter 2 in step S4 in the working memory 6.

(Step S6)
The sequencer 5 disables the ΔΣ modulator 1 and the digital filter 2.

(Step S7)
The sequencer 5 switches the multiplexer 4 to the channel ch5 and enables the ΔΣ modulator 1 and the digital filter 2.

(Step S8)
The sequencer 5 stores an output Vch5 (see FIG. 4) output from the digital filter 2 in step S7 in the working memory 6.

(Step S9)
The sequencer 5 disables the ΔΣ modulator 1 and the digital filter 2.

(Step S10)
The sequencer 5 reads Vch4 and Vch5 from the working memory 6, substitutes "1" for x, Vch4 for y, and Vch5 for z in the multiply adder 7, and causes the multiply adder 7 to perform a calculation "xy−z".

(Step S11)
The sequencer 5 substitutes "1" for x and the calculation result of step S10 for y in the divider 8, causes the divider 8 to perform a calculation "x/y" to obtain the gain correction factor α expressed by formula (6) above, and stores the obtained gain correction factor α in the working memory 6.

(Step S12)
The sequencer 5 reads Vch4 and Vch5 from the working memory 6, substitutes "1" for x, Vch4 for y, and Vch5 for z in the multiply adder 7, and causes the multiply adder 7 to perform a calculation "(xy+z)/2" by shifting the result of "xy+z" by one bit to the right.

(Step S13)
The sequencer 5 reads the gain correction factor α from the working memory 6, substitutes the gain correction factor α for x, the calculation result of step S12 for y, and "0" for z in the multiply adder 7, causes the multiply adder 7 to perform a calculation "−xy+z" to obtain the offset correction factor β expressed by formula (6) above, and stores the obtained offset correction factor β in the working memory 6.

The gain correction factor α and the offset correction factor β obtained through the above process may be stored in a non-volatile memory 13 (e.g., EEPROM, see FIG. 1) of the sensor output correction circuit 12. Saving the factors α and β in the non-volatile memory 13 eliminates the need to calculate the factors α and β each time the sensor output correction circuit 12 is turned off.

When receiving an instruction to correct the output data Vraw of the digital filter 2 using the correction values α and β (the gain correction factor α and the offset correction factor β) while the output data Vraw is stored in the working memory 6, the sequencer 5 performs steps S21 and S22 described below according to the instruction.

(Step S21)
The sequencer 5 reads, from the working memory 6, the output data Vraw of the digital filter 2, the correction value α obtained in step S11, and the correction value β obtained in step S13.

(Step S22)

The sequencer 5 substitutes the output data Vraw for x, the factor α for y, and the factor β for z in the multiply adder 7, causes the multiply adder 7 to perform a calculation "xy+z" to calculate Vcomp expressed by formula (2) above, and stores Vcomp as the corrected output data Vraw in the working memory 6.

With the sequencer 5 configured as described above, it is possible to freely set the timing to calculate correction values α and β and the timing to correct the output data Vraw. This in turn makes it possible to minimize the number of times that the correction values α and β are calculated.

Accordingly, the above embodiment makes it possible to calculate correction values for correcting the output data Vraw using the arithmetic circuit 9 of the digital domain even when the gain and offset of the AD converter 3 deviate from reference values due to the voltage dependence and individual difference of the sensor output correction circuit 12. Also, using the correction values makes it possible to simplify a sensor correction system and to accurately and quickly correct the output data Vraw.

For example, with the related-art configuration, when a dry battery is used as the power supply for a sensor output correction circuit during an inspection process, the accuracy of correcting a sensor output may be reduced due to variation in the supply voltage. Meanwhile, with the configuration of the present embodiment, since correction values are calculated by the arithmetic circuit 9 based on actually-obtained output data Vraw and used to correct the output data Vraw, the accuracy of correcting the output data Vraw is not reduced even when the supply voltage varies.

Also, the configuration of the present embodiment makes it possible to freely set the timing to calculate correction values and the timing to correct the output data Vraw, and thereby makes it possible to minimize the number of times that the correction values are calculated. Further, according to the present embodiment, the input voltage range of the ΔΣ modulator 1 is limited to 2 VREF between −VREF and +VREF within the full scale range of 4 VREF. This configuration makes it possible to prevent saturation of the arithmetic circuit 9 of the digital domain and thereby makes it possible to correct the output data Vraw even when the gain and offset of the AD converter 3 vary greatly.

Preferred embodiments of the present invention are described above. However, the present invention is not limited to the specifically disclosed embodiments, and variations and modifications may be made without departing from the scope of the present invention.

For example, when the input voltage range of the ΔΣ modulator 1 is known beforehand, it is possible to improve the correction accuracy by calculating correction values using two points corresponding to two of +VREF, ±0, and −VREF illustrated in FIG. 4.

For example, when the input voltage range of the ΔΣ modulator 1 is from 0V to +VREF, the gain correction factor α can be expressed by formula (7) below using two points corresponding to +VREF and ±0. Meanwhile, when the input voltage range of the ΔΣ modulator 1 is from −VREF to 0V, the gain correction factor α can be expressed by formula (8) below using two point corresponding to ±0 and −VREF.

$$\alpha = \frac{1}{2(V_{ch4} - V_{ch3})} \quad (7)$$

$$\alpha = \frac{1}{2(V_{ch3} - V_{ch5})} \quad (8)$$

Also, the offset correction factor β can be obtained by averaging output data Vraw at three points as expressed by formula (9) below. Also, the offset correction factor β can be obtained by using output data Vraw at one point as expressed by formula (10) below. Since the offset correction factor β changes according to the change of the gain correction factor α, various combinations of α and β can be obtained.

$$\beta = -\frac{(V_{ch4} + V_{ch3} + V_{ch5})}{3}\alpha \quad (9)$$

$$\beta = -V_{ch3}\alpha \quad (10)$$

Also, output data Vraw may be corrected by second-order correction. For example, when correction values are α, β, and γ, the corrected AD conversion result Vcomp cam be expressed by formula (11) below.

$$V_{comp} = (\gamma V_{raw} + \alpha)V_{raw} + \beta \quad (11)$$

By substituting formulas (12) obtained from FIG. 4 in formula (11) and finding solutions of resulting simultaneous equations, formulas (13) representing the correction values α, β, and γ can be obtained. Formulas (13) can be calculated using the multiply adder 7 and the divider 8.

$$\left.\begin{array}{l} V_{raw} = V_{ch3}, V_{comp} = 0 \\ V_{raw} = V_{ch4}, V_{comp} = 1/2 \\ V_{raw} = V_{ch5}, V_{comp} = -1/2 \end{array}\right\} \quad (12)$$

$$\left.\begin{array}{l} \gamma = \frac{1}{2}\frac{(V_{ch4} - V_{ch3}) - (V_{ch3} - V_{ch5})}{(V_{ch4} - V_{ch3})(V_{ch3} - V_{ch5})(V_{ch5} - V_{ch4})} \\ \alpha = \frac{1}{2}\frac{-(V_{ch4} + V_{ch3})(V_{ch4} - V_{ch3}) + (V_{ch3} + V_{ch5})(V_{ch3} - V_{ch5})}{(V_{ch4} - V_{ch3})(V_{ch3} - V_{ch5})(V_{ch5} - V_{ch4})} \\ \beta = \frac{1}{2}\frac{V_{ch4}V_{ch3}(V_{ch4} - V_{ch3}) - V_{ch3}V_{ch5}(V_{ch3} - V_{ch5})}{(V_{ch4} - V_{ch3})(V_{ch3} - V_{ch5})(V_{ch5} - V_{ch4})} \end{array}\right\} \quad (13)$$

In this case, the sequencer 5 causes the multiply adder 7 to perform the calculation "xy+z" two times using the correction values α, β, and γ to obtain Vcomp expressed by formula (11) above, and stores Vcomp as the corrected output data Vraw in the working memory 6.

The sensor output correction circuit 12 can also correct sensor outputs from plural sensors. For example, when a detection voltage corresponding to a detection signal of the sensor 22 is input to the input channel ch1 and a detection voltage corresponding to a detection signal of the sensor 23 is input to the input channel ch2, it is possible to correct the sensor outputs from the sensors 22 and 23 by causing the multiplexer 4 to switch the detection voltages to be input to the ΔΣ modulator 1.

In the above embodiment, the sequencer 5 is used as an example of a control unit for controlling the multiplexer 4, the AD converter 3, and the arithmetic circuit 9. Alternatively, a microcomputer may be used as the control unit.

An aspect of this disclosure provides a sensor output correction circuit, a sensor output correction device, and a sensor output correction method that can accurately correct sensor outputs.

What is claimed is:

1. A sensor output correction circuit, comprising:
    an analog-to-digital converter configured to receive an input voltage corresponding to a sensor output of a sensor and a reference voltage that are selectively input to the analog-to-digital converter and configured to generate output data; and
    an arithmetic unit including a multiply adder and a non-restoring divider configured to correct the output data, which is output from the analog-to-digital converter when the input voltage is input to the analog-to-digital converter, based on an output value that is output from the analog-to-digital converter when the reference voltage is input to the analog-to-digital converter.

2. The sensor output correction circuit as claimed in claim 1, wherein the arithmetic unit is configured to correct a deviation of the output data which is caused by variation of a gain and an offset of the analog-to-digital converter.

3. The sensor output correction circuit as claimed in claim 1, wherein
    the analog-to-digital converter is configured to receive plural reference voltages of different values; and
    the arithmetic unit is configured to correct the output data based on plural output values that are output from the analog-to-digital converter when the corresponding reference voltages are input to the analog-to-digital converter.

4. The sensor output correction circuit as claimed in claim 1, wherein the arithmetic unit is configured to calculate correction data for correcting the output data based on the output value.

5. The sensor output correction circuit as claimed in claim 4, wherein the correction data is a factor.

6. A sensor output correction device, comprising:
    the sensor output correction circuit of claim 1; and
    a sensor.

7. A method performed by a sensor output correction circuit including an analog-to-digital converter, a multiply adder, and a non-restoring divider, the method comprising:
    measuring a first reference voltage by the analog-to-digital converter;
    measuring a second reference voltage by the analog-to-digital converter;
    substituting 1 for x, the first reference voltage for y, and the second reference voltage for z and performing a calculation xy−z by the multiply adder, said x, y and z being input values of the multiply adder;
    substituting 1 for x2 and a result of the calculation xy−z for y2 and performing a calculation x2/y2 by the divider, said x2 and y2 being input values of the divider;
    substituting 1 for x3, the first reference voltage for y3, and the second reference voltage for z2 and performing a calculation (x3y3+z2)/2 by the multiply adder, said x3, y3 and z2 being input values of the multiply adder;
    substituting a result of the calculation x2/y2 for x4, a result of the calculation (x3y3+z2)/2 for y4, and 0 for z3 and performing a calculation −x4y4+z3 by the multiply adder, said x4, y4 and z3 being input values of the multiply adder;
    measuring a sensor output from a sensor by the analog-to-digital converter; and
    substituting the measured sensor output for x5, the result of the calculation x2/y2 for y5, and a result of the calculation −x4y4+z3 for z4 and performing a calculation x5y5+z4 by the multiply adder to correct the sensor output, said x5, y5 and z4 being input values of the multiply adder.

* * * * *